United States Patent
Hanafusa et al.

(10) Patent No.: US 11,754,344 B2
(45) Date of Patent: Sep. 12, 2023

(54) BOILING COOLER

(71) Applicant: Sumitomo Precision Products Co., Ltd., Amagasaki (JP)

(72) Inventors: Shota Hanafusa, Amagasaki (JP); Keiji Miki, Amagasaki (JP); Kenji Ando, Amagasaki (JP)

(73) Assignee: Sumitomo Precision Products Co., Ltd., Amagasaki (JP)

( * ) Notice: Subject to any disclaimer, the term of this patent is extended or adjusted under 35 U.S.C. 154(b) by 31 days.

(21) Appl. No.: 16/963,014

(22) PCT Filed: Jan. 19, 2018

(86) PCT No.: PCT/JP2018/001534
§ 371 (c)(1),
(2) Date: Jul. 17, 2020

(87) PCT Pub. No.: WO2019/142310
PCT Pub. Date: Jul. 25, 2019

(65) Prior Publication Data
US 2020/0340754 A1    Oct. 29, 2020

(51) Int. Cl.
*F28D 15/02* (2006.01)
*H05K 7/20* (2006.01)

(52) U.S. Cl.
CPC ..... *F28D 15/0233* (2013.01); *F28D 15/0266* (2013.01); *H05K 7/2039* (2013.01)

(58) Field of Classification Search
CPC .............. H05K 7/2039; H05K 7/20672; F28D 15/0266; F28D 15/0233; F28D 15/02
See application file for complete search history.

(56) References Cited

U.S. PATENT DOCUMENTS 5,940,270 A * 8/1999 Puckett ............... F28D 15/0266
    361/699
5,998,863 A * 12/1999 Kobayashi ............... F28F 3/12
    361/699
6,005,772 A * 12/1999 Terao .................. F28D 15/0266
    165/80.4

(Continued)

FOREIGN PATENT DOCUMENTS

CN        1556911 A    12/2004
CN       205793890 U    12/2016

(Continued)

OTHER PUBLICATIONS

International Search Report, PCT application No. PCT/JP2018/001534 (Year: 2018).*

(Continued)

*Primary Examiner* — Tho V Duong
(74) *Attorney, Agent, or Firm* — Crowell & Moring LLP

(57) ABSTRACT

A boiling cooler includes a boiling part, a condensing part arranged in a substantially horizontal direction with respect to the boiling part, and a connecting pipe that connects the boiling part to the condensing part. The condensing part includes a plurality of stages of refrigerant passages, a first external passage provided between the refrigerant passages, and a second external passage provided on an outer surface of at least one of an uppermost refrigerant passage and a lowermost refrigerant passage.

6 Claims, 4 Drawing Sheets

(56) References Cited

U.S. PATENT DOCUMENTS

| | | | |
|---|---|---|---|
| 7,231,961 B2* | 6/2007 | Alex | F28F 3/12 165/80.4 |
| 7,958,935 B2* | 6/2011 | Belits | F28F 3/12 165/104.21 |
| 9,797,659 B2* | 10/2017 | Wan | F28D 15/025 |
| 2003/0051859 A1 | 3/2003 | Chesser et al. | |
| 2003/0051860 A1 | 3/2003 | Montgomery et al. | |
| 2004/0040695 A1 | 3/2004 | Chesser et al. | |
| 2004/0050533 A1 | 3/2004 | Chesser et al. | |
| 2014/0331709 A1* | 11/2014 | Chiba | H01L 23/427 62/404 |
| 2014/0345829 A1* | 11/2014 | Kang | H01L 23/427 165/104.21 |
| 2016/0341488 A1 | 11/2016 | Wan et al. | |

FOREIGN PATENT DOCUMENTS

| | | | | |
|---|---|---|---|---|
| JP | 2013-33807 A | | 2/2013 | |
| JP | 2013033807 | * | 2/2013 | F28D 15/02 |
| JP | 2016-9828 A | | 1/2016 | |
| WO | WO 03/056626 A1 | | 7/2003 | |
| WO | WO-2013018667 A1 | * | 2/2013 | F28D 15/0266 |
| WO | WO-2014147838 A1 | * | 9/2014 | H05K 7/20318 |
| WO | WO201512895 | * | 9/2015 | H01L 23/427 |
| WO | WO-2017010536 A1 | * | 1/2017 | F28D 15/02 |

OTHER PUBLICATIONS

Chinese-language Office Action issued in Chinese Application No. 201880086162.8 dated Mar. 31, 2021 with English translation (nine (9) pages).

International Search Report (PCT/ISA/210) issued in PCT Application No. PCT/JP2018/001534 dated Mar. 27, 2018 with English translation (four pages).

Japanese-language Written Opinion (PCT/ISA/237) issued in PCT Application No. PCT/JP2018/001534 dated Mar. 27, 2018 (four pages).

* cited by examiner

BOILING COOLER

TECHNICAL FIELD

The present invention relates to a boiling cooler, and more particularly, it relates to a boiling cooler that circulates a refrigerant between a boiling part that boils the refrigerant and a condensing part that condenses the vaporized refrigerant.

BACKGROUND ART

Conventionally, a boiling cooler that circulates a refrigerant between a boiling part and a condensing part is known. Such a boiling cooler is disclosed in Japanese Patent Laid-Open No. 2016-009828, for example.

Japanese Patent Laid-Open No. 2016-009828 discloses a boiling cooler including one boiling part, one condensing part, and one substantially horizontal flow path that connects the boiling part to the condensing part. The boiling part includes a bottom plate that defines a bottom wall and a tubular frame that defines a peripheral wall. The flow path and the condensing part include an intermediate plate and a dish-shaped upper plate having a concave surface that faces the intermediate plate. The intermediate plate includes a connection hole with the upper end of the tubular frame (an upper opening of the boiling part) at one end side, includes a portion that defines a bottom wall of the condensing part at the other end side, and includes a portion that defines a bottom wall of the flow path in the middle of the length. The upper plate includes a portion that defines a top wall that covers the upper opening of the boiling part on one end side, includes a portion that defines a top wall of the condensing part on the other end side, and includes a portion that defines a top wall of the flow path in the middle of the length. Therefore, the flow path is arranged on the upper surface (upper opening) of the boiling part and extends in a substantially horizontal direction to the condensing part. Outer fins are provided on the lower surface of the condensing part. The boiling cooler disclosed in Japanese Patent Laid-Open No. 2016-009828 is used to cool a heating element such as a central processing unit (CPU) in a server or the like.

PRIOR ART

Patent Document

Patent Document 1: Japanese Patent Laid-Open No. 2016-009828

SUMMARY OF THE INVENTION

Problems to be Solved by the Invention

Incidentally, a device such as a server is designed to fit within a height space defined by the server rack standards. Therefore, the cooler is also required to fit within the height space defined in the server rack standards. Note that the prevailing server rack standards (EIA standards) define 1 U (=44.45 mm) as a unit of height space.

On the other hand, the amount of heat generated by a heat source such as a CPU increases as the device performance of the server or the like is improved. Therefore, a cooler for this type of application is required to ensure sufficient cooling performance while fitting within a predetermined height dimension.

However, in the boiling cooler disclosed in Japanese Patent Laid-Open No. 2016-009828, due to the structure in which the flow path that horizontally extends and the condensing part are installed on the upper surface (upper opening) of the boiling part, the sum of the height dimension of the boiling part and the height dimension of the flow path and the condensing part becomes a factor to increase the total height dimension of the boiling cooler. Therefore, there is a problem that it is difficult to reduce the height dimension. There is also a problem that it is difficult to ensure sufficient cooling performance simply by reducing the height dimension simply by reducing the size of the boiling part or the condensing part.

The present invention has been proposed in order to solve the aforementioned problems, and one object of the present invention is to provide a boiling cooler capable of ensuring cooling performance while significantly reducing or preventing an increase in height dimension.

Means for Solving the Problems

In order to attain the aforementioned object, a boiling cooler according to the present invention includes a boiling part including a heat receiving surface thermally connected to a heat source, the boiling part boiling a refrigerant contained in an internal space thereof, a condensing part arranged in a substantially horizontal direction with respect to the boiling part, the condensing part condensing a refrigerant gas by heat exchange with an external fluid, and a connecting pipe that connects the boiling part to the condensing part and circulates the refrigerant. The condensing part includes a plurality of stages of refrigerant passages aligned in a height direction perpendicular to the horizontal direction, and a first external passage for the external fluid provided between the plurality of stages of refrigerant passages, and a second external passage for the external fluid provided on an outer surface of at least one of an uppermost refrigerant passage and a lowermost refrigerant passage. The term, "an outer surface of at least one of an uppermost refrigerant passage and a lowermost refrigerant passage" refers to one or both of the upper surface of the uppermost refrigerant passage and the lower surface of the lowermost refrigerant passage.

In the boiling cooler according to the present invention, as described above, the condensing part arranged in the substantially horizontal direction with respect to the boiling part includes the plurality of stages of refrigerant passages aligned in the height direction such that as compared with a case in which the refrigerant passages are arranged above the boiling part, the height dimension can be reduced, and even within a predetermined height dimension, a sufficient heat transfer area (heat radiation area) can be ensured due to each refrigerant passage, effectively utilizing a height space. Furthermore, the first external passage is provided between the plurality of stages of refrigerant passages, and thus heat exchange with the external fluid in each of the refrigerant passages can be efficiently performed unlike the structure in which a plurality of refrigerant passages are simply stacked directly. In addition, the second external passage is also provided on at least one of the uppermost and lowermost refrigerant passages, and thus the heat radiation performance can be improved due to the second external passage. Therefore, it is possible to balance a reduction in the height dimension and an improvement in the heat radiation performance. Consequently, according to the present invention, the cooling performance can be ensured while an increase in the height dimension is significantly reduced or prevented.

In the aforementioned invention, a range in the height direction in which the internal space of the boiling part is formed overlaps, in the height direction, a range in the height direction in which the lowermost refrigerant passage of the condensing part is formed. Accordingly, the lowermost refrigerant passage and the boiling part can be provided at the same height unlike the configuration in which the lowermost refrigerant passage is arranged above the boiling part, and thus an increase in the height dimension of the boiling cooler can be significantly reduced or prevented. Consequently, it is possible to easily ensure a space in which the plurality of stages of refrigerant passages are provided even within the predetermined height dimension.

In the aforementioned invention, the connecting pipe preferably connects a side surface of the boiling part to a side surface of the condensing part. Accordingly, unlike the configuration in which the connecting pipe is arranged on the upper surface of the boiling part, the refrigerant passages of the condensing part and the side surface of the boiling part can be connected to each other in a lateral direction, and thus an increase in the height dimension of the boiling cooler can be effectively significantly reduced or prevented.

In the aforementioned invention, the heat receiving surface of the boiling part is preferably arranged above a lower surface of the condensing part. Accordingly, when the heat source is a chip of a CPU or the like of a server, for example, the heat source mounted on a circuit board can be attached to the heat receiving surface displaced upward by the thickness of the heat source from the lower surface of the condensing part to be cooled. On the other hand, it is not necessary to displace the lower surface of the condensing part upward, and thus the heat radiation performance can be ensured, maximizing the use of an installable height space with respect to the condensing part, which is more likely to be restricted by the height space.

In the aforementioned invention, the second external passage is preferably provided on at least a lower surface of the lowermost refrigerant passage. In the boiling cooler, the refrigerant liquid condensed in the refrigerant passages needs to be returned to the boiling part, and thus the refrigerant passages are arranged above the inner bottom surface of the boiling part unless a pump or the like is used. Therefore, with the aforementioned configuration, the lowermost refrigerant passage can be arranged upward due to the second external passage. Consequently, even when the condensing part is arranged in the lateral direction with respect to the boiling part, utilizing the second external passage that improves the heat radiation performance, the arrangement position of the lowermost refrigerant passage can be easily raised.

In this case, the second external passage preferably includes an upper end located above an inner bottom surface of the boiling part and adjacent to the lower surface of the lowermost refrigerant passage. Accordingly, the lowermost refrigerant passage can be arranged above the inner bottom surface of the boiling part even when the condensing part is arranged in the lateral direction with respect to the boiling part. In addition, the second external passage is provided to a position above the inner bottom surface of the boiling part, and the height of the second external passage on the lower surface side of the lowermost refrigerant passage is increased such that high heat exchange performance with the external fluid can be ensured. Thus, the lowermost refrigerant passage can be reliably arranged above the inner bottom surface of the boiling part while the heat exchange performance with the external fluid is ensured.

In the aforementioned configuration in which the upper end of the second external passage is located above the inner bottom surface of the boiling part, the second external passage preferably has a height dimension larger than a height dimension of the first external passage. Accordingly, even in the configuration in which the plurality of stages of refrigerant passages are provided in the height direction, and the first external passage is provided between the plurality of stages of refrigerant passages, the height dimension of the lowermost second external passage is increased such that the height of the refrigerant passages required to return the refrigerant liquid to the boiling part can be easily ensured. Furthermore, unlike a case in which a support post or a space is simply provided on the lower surface side of the refrigerant passages such that the height of the refrigerant passages is ensured, the second external passage, the height dimension of which is increased by a space required to ensure the height of the refrigerant passages, is provided such that heat exchange with the external fluid can be actively performed. Thus, the heat exchange performance with the external fluid can be improved.

In the aforementioned configuration in which the connecting pipe connects the side surface of the boiling part to the side surface of the condensing part, the connecting pipe is preferably provided such that a liquid level of the refrigerant is arranged at a predetermined height inside the connecting pipe. Accordingly, in addition to the boiling part, the connecting pipe is filled with the refrigerant liquid to the predetermined height, and thus even when the amount of heat generated by the heat source is large, vaporization of the entire refrigerant liquid in the boiling part can be significantly reduced or prevented. Moreover, when the refrigerant liquid condensed by the condensing part is returned to the boiling part side, the same can merge with the stored refrigerant liquid when reaching the position of the liquid level inside the connecting pipe. Therefore, the refrigerant liquid that merges inside the connecting pipe can be reused to cool the heat source in the boiling part.

Effect of the Invention

According to the present invention, as described above, it is possible to ensure the cooling performance while significantly reducing or preventing an increase in the height dimension.

MODES FOR CARRYING OUT THE INVENTION

An embodiment of the present invention is hereinafter described on the basis of the drawings.

The configuration of a boiling cooler 100 (hereinafter referred to as a cooler 100) according to the present embodiment is described with reference to FIGS. 1 to 10. The cooler 100 is a cooler of a boiling cooling system that absorbs heat from a heat source HS and radiates the heat to the outside, using a phase change cycle of vaporization and condensation of a refrigerant. The heat source HS is not particularly limited, but is a semiconductor chip or an electronic circuit of a CPU mounted on an electronic device such as a server, for example. The cooler 100 according to the present embodiment is particularly suitably applied to an application installed in a space with a limited installation height, such as cooling of a CPU of a server or the like installed in a server rack.

An example in which the heat source HS is a CPU of a server or the like is described below. The unit of height space of a server rack in which the server including the heat source HS is installed is defined as 1 U (=44.45 mm) by the server rack standards (EIA standards). In the present embodiment, an example of the cooler 100 configured to fit within a space having a height H0 of 1 U (=44.45 mm) as a minimum unit of installation height is described.

(Overall Configuration of Cooler)

Figure 1:
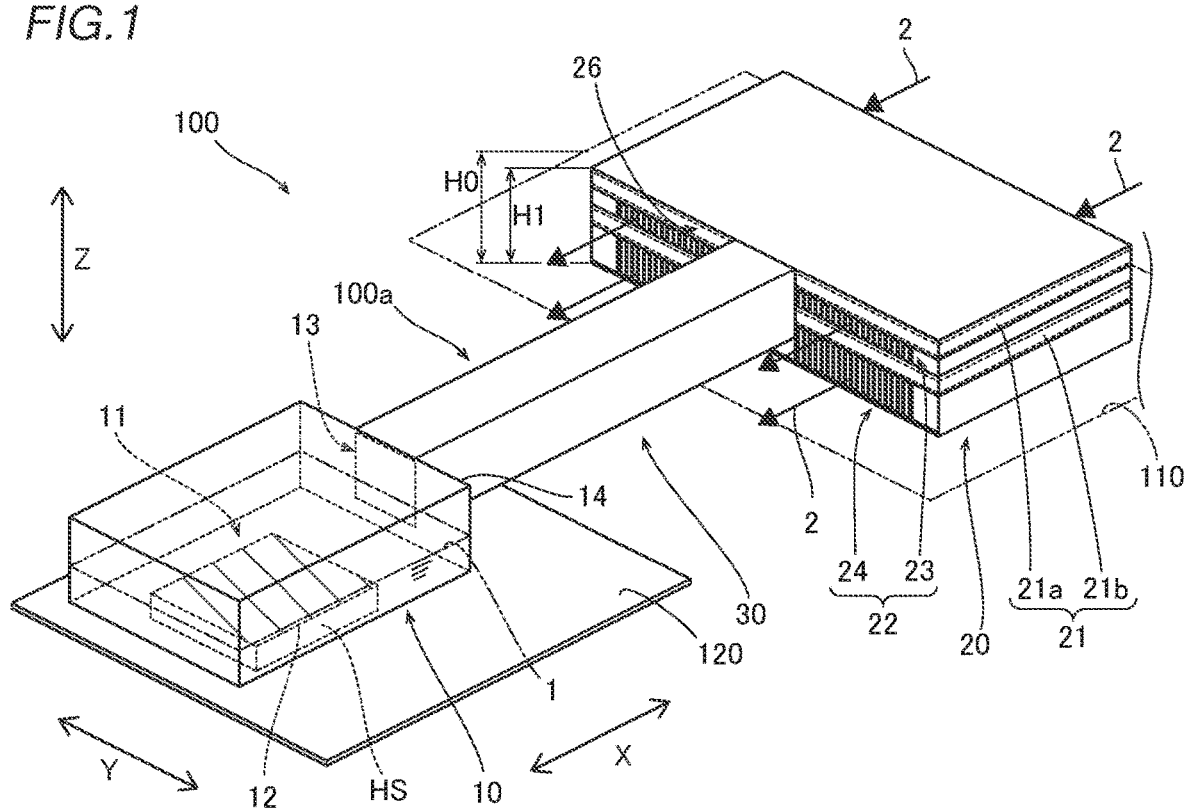
FIG. 1 A perspective view schematically showing the overall configuration of a cooler according to an embodiment.
Figure 2:
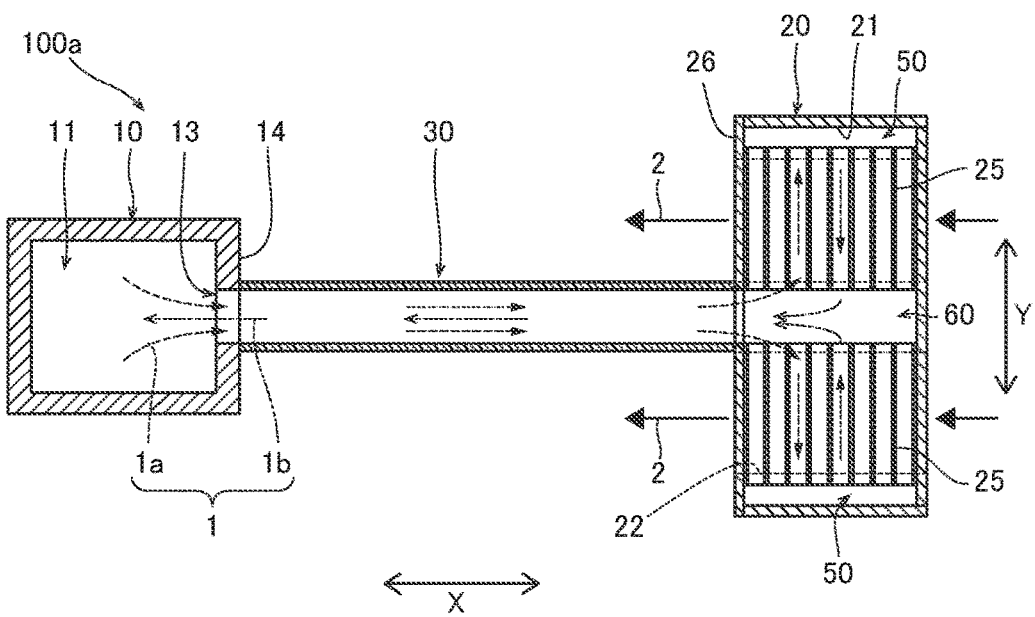
FIG. 2 A horizontal sectional view schematically showing the overall configuration of the cooler in FIG. 1.

As shown in FIGS. 1 and 2, the cooler 100 includes a boiling part 10, a condensing part 20, and a connecting pipe 30. The boiling part 10 and the condensing part 20 are connected by the connecting pipe 30 such that a single cooler body 100a is formed. The cooler body 100a is made of a metal material having high thermal conductivity, such as aluminum (including an aluminum alloy) and copper (including a copper alloy). The cooler 100 includes a hermetically sealed internal space defined by the boiling part 10, the connecting pipe 30, and refrigerant passages 21 of the condensing part 20 described below. A refrigerant 1 is contained in this hermetically sealed space.

The refrigerant 1 is not particularly limited as long as the same can change into a gas phase and a liquid phase. Therefore, the refrigerant 1 may be selected from known ones according to the heat source HS, and fluorocarbon, hydrocarbon, water, or the like can be adopted, for example. The hermetically sealed internal space of the cooler 100 is depressurized to a substantially vacuum state, and is in a saturated vapor state by the vapor-phase refrigerant 1. When the state of the refrigerant 1 is distinguished, the gas-phase refrigerant 1 is hereinafter referred to as a refrigerant gas 1a, and the liquid-phase refrigerant 1 is hereinafter referred to as a refrigerant liquid 1b (see FIG. 2) for convenience.

The cooler body 100a is installed on an installation surface 110. The installation surface 110 is a housing of the server installed in the server rack or a mount member attached to the server rack, for example. The cooler body 100a is configured to fit within the height H0 from the installation surface 110. Generally, the installation surface 110 substantially coincides with a horizontal direction. The term "substantially coincide" denotes that the installation surface 110 is allowed to be slightly inclined with respect to the horizontal direction due to the inclination of the server rack itself or the housing, for example. In the horizontal direction, a direction in which the boiling part 10 and the condensing part 20 face each other (a direction in which the connecting pipe 30 extends in FIG. 1) is defined as an X direction, and a direction orthogonal to the X direction is defined as a Y direction. A Z direction perpendicular to the horizontal direction is defined as a height direction.

The boiling part 10 is configured to boil the refrigerant 1 contained in the internal space 11. Specifically, the boiling part 10 has a hollow box shape in which the internal space 11 capable of containing the refrigerant 1 is formed. The boiling part 10 includes an upper surface, a lower surface, and horizontal side surfaces. Furthermore, the boiling part 10 includes a heat receiving surface 12 (see a hatched portion in FIG. 1) thermally connected to the heat source HS. The heat receiving surface 12 is provided on the lower surface of the boiling part 10. The heat receiving surface 12 contacts the heat source HS via thermal conductive grease, for example. The boiling part 10 transfers the heat from the heat source HS absorbed from the heat receiving surface 12 to the internal refrigerant 1 to boil (vaporize) the refrigerant 1. The heat source HS is cooled by heat of vaporization absorbed when the refrigerant 1 vaporizes. The boiling part 10 is filled with the vaporized refrigerant gas 1a, and the vaporized refrigerant gas 1a flows into the connecting pipe 30 via a connection port 13 provided on a side surface 14 of the boiling part 10.

The condensing part 20 is arranged in the horizontal direction with respect to the boiling part 10. In an example of FIGS. 1 and 2, the condensing part 20 is spaced apart from the boiling part 10 by a predetermined distance in the X direction. The predetermined distance corresponds to the length of the connecting pipe 30. The condensing part 20 is configured to condense the refrigerant gas 1a by heat exchange with an external fluid 2. The external fluid 2 is not particularly limited, but is air, for example.

The condensing part 20 includes an upper surface, a lower surface, and horizontal side surfaces. The condensing part 20 has a rectangular parallelepiped shape that extends in the Y direction, and the connecting pipe 30 is connected to a central portion of the condensing part 20 in the Y direction.

The condensing part 20 includes the hollow refrigerant passages 21 capable of containing the refrigerant 1. The refrigerant gas 1a vaporized by the boiling part 10 flows into the refrigerant passages 21 via the connecting pipe 30. The condensing part 20 transfers the heat of the refrigerant gas 1a that has flowed into the refrigerant passages 21 to the external fluid 2 outside the refrigerant passages 21 to condense (liquefy) the refrigerant gas 1a. Due to the heat exchange with the external fluid 2, condensation heat released when the refrigerant 1 is condensed is discharged to the outside of the refrigerant passages 21. The condensed refrigerant liquid 1b flows into the connecting pipe 30 via the refrigerant passages 21 mainly due to the action of gravity as the amount of condensed liquid increases.

Consequently, inside the cooler 100, the refrigerant 1 circulates between the boiling part 10 and the condensing part 20 so as to repeat the phase change cycle of vaporizing the refrigerant 1 in the boiling part 10 and condensing the refrigerant 1 in the condensing part 20.

Figure 3:
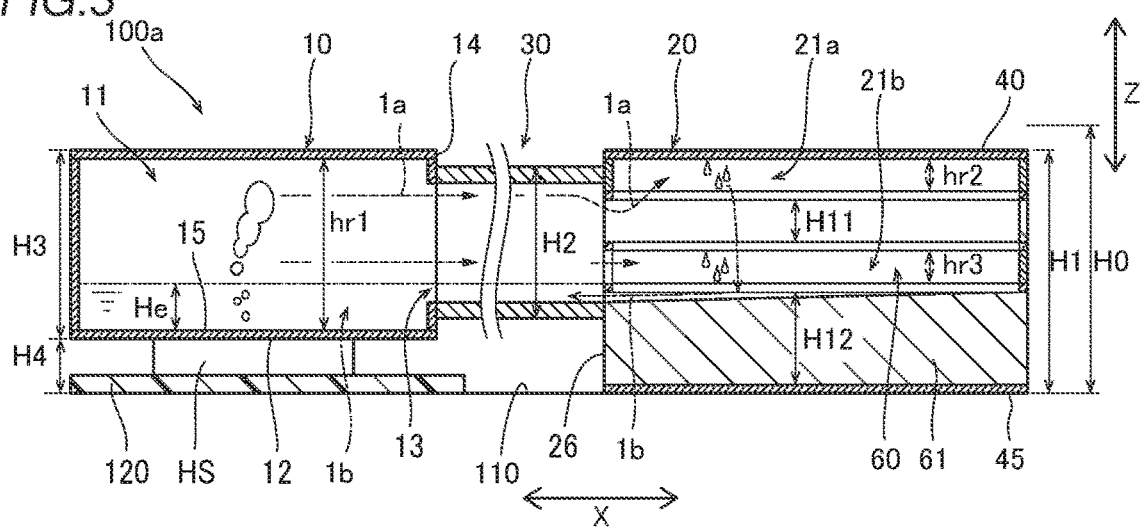
FIG. 3 A schematic longitudinal sectional view of the cooler along an XZ direction.
Figure 4:
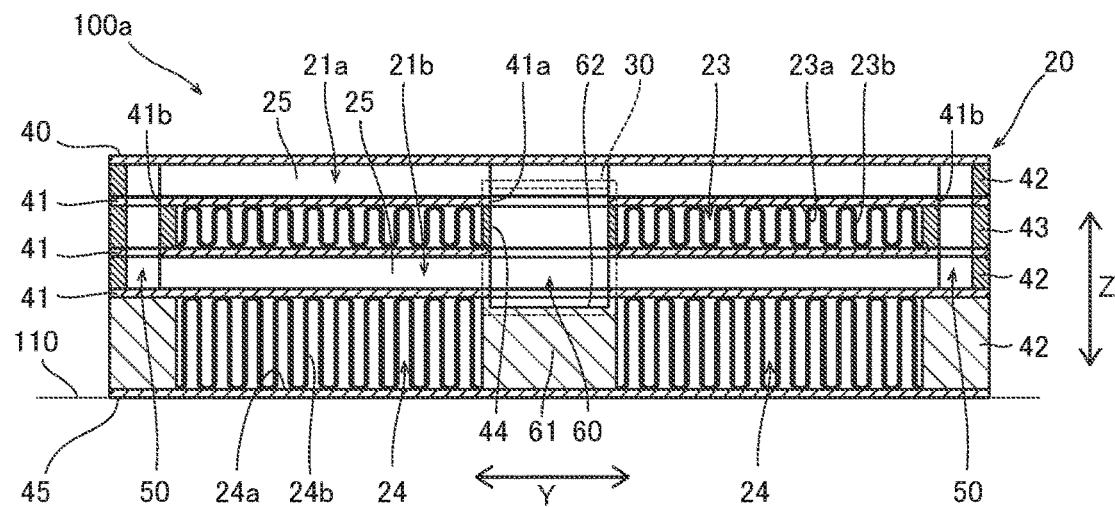
FIG. 4 A schematic longitudinal sectional view along a YZ direction showing the internal structure of a condensing part in FIG. 1.

As shown in FIGS. 3 and 4, in the present embodiment, the condensing part 20 includes a plurality of stages of refrigerant passages 21 aligned in the height direction (Z direction) perpendicular to the horizontal direction. The number of stages (the number) of refrigerant passages 21 is not particularly limited as long as the same is plural. FIGS. 3 and 4 show an example in which the condensing part 20 includes two stages of refrigerant passages 21 (two refrigerant passages 21).

The condensing part 20 also includes external passages 22 (see FIG. 4) through which the external fluid 2 flows. The external passages 22 include first external passages 23 for the external fluid provided between the plurality of stages of refrigerant passages 21 and second external passages 24 for the external fluid provided on the outer surface of at least one of the uppermost refrigerant passage 21 and the lowermost refrigerant passage 21. FIGS. 3 and 4 show an example in which the second external passages 24 are provided on the outer surface (lower surface) of the lowermost refrigerant passage 21b, and are not provided on the outer surface (upper surface) of the uppermost refrigerant passage 21a.

The condensing part 20 shown in FIG. 4 has a shape in which the plurality of stages of refrigerant passages 21 and the external passages 22 (the first external passages 23 and the second external passages 24) are alternately stacked in the height direction. That is, the second external passages 24, the lowermost refrigerant passage 21b, the first external passages 23, and the uppermost refrigerant passage 21a are stacked in this order from the lower side (installation surface 110 side) in the height direction (Z direction). Therefore, each refrigerant passage 21 is adjacent to the external passages 22 on at least one of the upper surface side and the lower surface side. Thus, it is possible to efficiently exchange heat with the external fluid 2 in each refrigerant passage 21 to condense the refrigerant gas 1a.

Each of the plurality of stages of refrigerant passages 21 communicates with the connecting pipe 30. That is, the refrigerant gas 1a can flow into each refrigerant passage 21 via the connecting pipe 30.

The condensing part 20 has a so-called plate-fin heat exchanger as a basic structure. Each refrigerant passage 21 has substantially the same configuration.

Each refrigerant passage 21 is configured as a flat plate-shaped flow path layer surrounded by upper and lower tube plates 41 (or a top plate 40) in the height direction and a side bar 42 provided along the outer peripheral edge. The upper surface of the uppermost refrigerant passage 21a is covered with the top plate 40. Inside each refrigerant passage 21, heat transfer fins 25 on the refrigerant side (see FIG. 2) are provided. The upper and lower tube plates 41 are primary heat transfer surfaces, and the heat transfer fins 25 are secondary heat transfer surfaces. Furthermore, the refrigerant passages 21 communicate with each other via connection passages 50 that pass through the first external passages 23 in the height direction.

Figure 5:
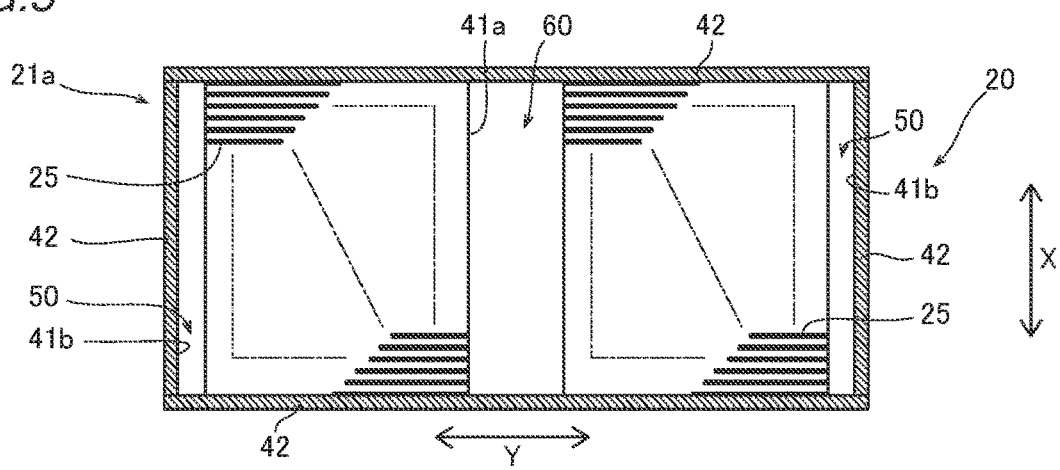
FIG. 5 A horizontal sectional view schematically showing an uppermost refrigerant passage.
Figure 6:
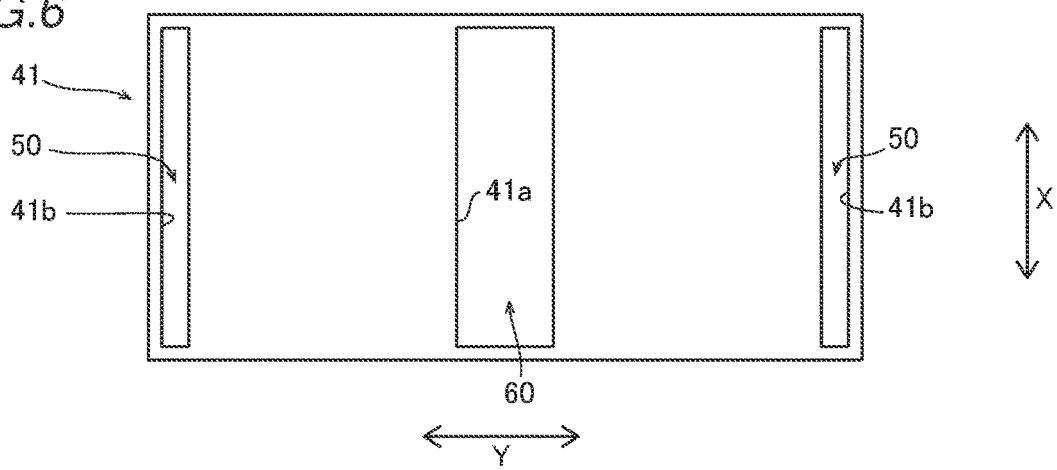
FIG. 6 A schematic plan view for illustrating a tube plate.
Figure 8:
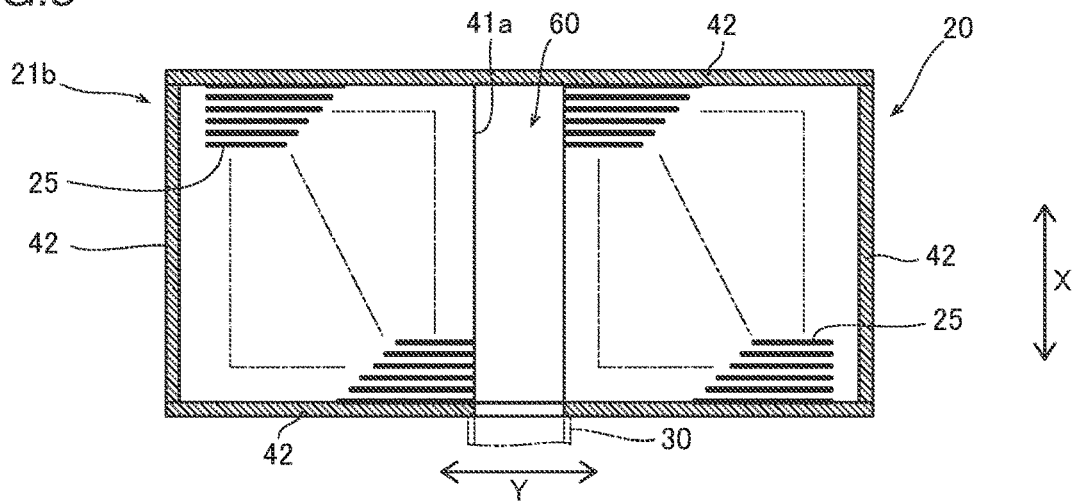
FIG. 8 A horizontal sectional view schematically showing a lowermost refrigerant passage.

Specifically, as shown in FIGS. 5 and 8, each refrigerant passage 21 has a central opening 41a through which the refrigerant 1 flows into or out of the central portion in the Y direction. The heat transfer fins 25 are provided along the Y direction on opposite sides in the Y direction with the central opening 41a interposed therebetween. Each refrigerant passage 21 includes end openings 41b that communicate with the connection passages 50 at both ends in the Y direction. As shown in FIG. 6, the central opening 41a and the end openings 41b are openings formed in the tube plates 41.

As shown in FIG. 4, the connection passages 50 connect the end openings 41b on the lower surface of the uppermost refrigerant passage 21a to the end openings 41b on the upper surface of the lowermost refrigerant passage 21b. The connection passages 50 include these end openings 41b and through-holes 43a that penetrate side bars 43 (see FIG. 7) that are side walls of the first external passages 23. Thus, the refrigerant liquid 1b condensed in the uppermost refrigerant passage 21a drops to the lowermost refrigerant passage 21b via the connection passages 50. The refrigerant liquid 1b accumulated in the lowermost refrigerant passage 21b flows into the connecting pipe 30 via the central opening 41a at the central portion in the Y direction.

In the present embodiment, a connection passage 60 that connects each refrigerant passage 21 in the height direction (Z direction) penetrates the first external passages 23 in the central opening 41a at the central portion in the Y direction. The connection passage 60 at the central portion in the Y direction is configured to introduce the refrigerant gas 1a into each refrigerant passage 21 from the connecting pipe 30 and drop the condensed refrigerant liquid 1b. The connection passage 60 is arranged at the central portion in the Y direction, which is the front of a connecting location with the connecting pipe 30, in the condensing part 20. The connection passage 60 that penetrates the condensing part 20 in the height direction (Z direction) is provided at the front of the connecting location with the connecting pipe 30 such that even when the plurality of stages of refrigerant passages 21 are provided in the height direction, the refrigerant gas 1a can be efficiently introduced into each refrigerant passage 21. The connection passage 60 includes the central opening 41a of the tube plates 41, and partition members 44 of the first external passages 23 (see FIG. 7) and partition members 61 (see FIG. 9) of the second external passages 24, which are described below.

Figure 7:
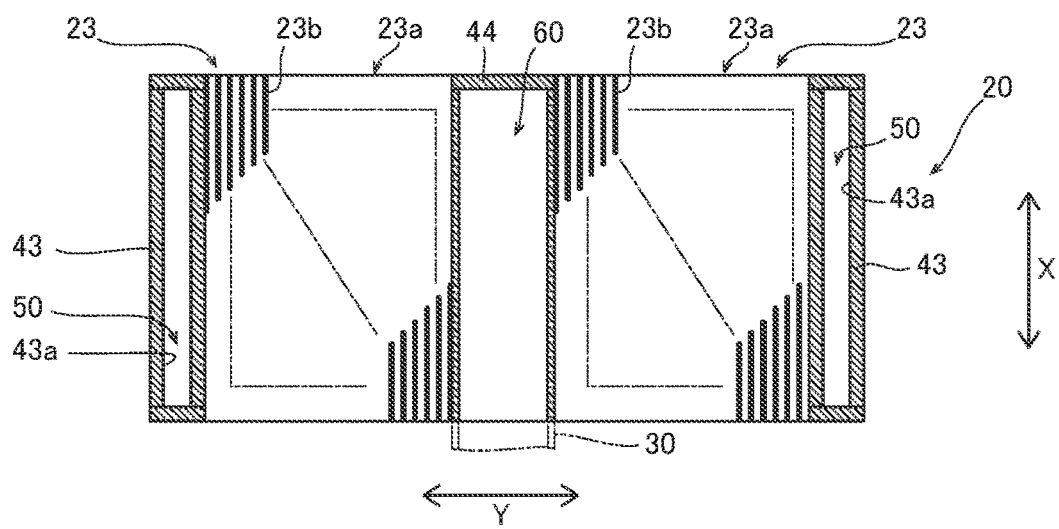
FIG. 7 A horizontal sectional view schematically showing first external passages.

The first external passages 23 are flow passages for the external fluid 2 that penetrate the condensing part 20 in the X direction. The first external passages 23 are adjacent to the different refrigerant passages 21 on the upper surface side and the lower surface side, respectively. The first external passages 23 are configured as flat plate-shaped flow path layers defined by the upper and lower tube plates 41 in the height direction, the side bars 43 provided along the outer peripheral edges, and the partition members 44 at the central portion in the Y direction. The refrigerant passages 21 include internal spaces together with the connecting pipe 30 and the boiling part 10 whereas the first external passages 23 include openings 23a open to the outside of the condensing part 20 at opposite ends in the X direction, as shown in FIG. 7. The openings 23a of the first external passages 23 are respectively provided on opposite sides in the Y direction with the partition members 44 (connection passage 60) at the central portion in the Y direction, which is connected to the connecting pipe 30, interposed therebetween. Thus, a pair of first external passages 23 are provided on opposite sides in the Y direction so as to penetrate the condensing part 20 in the X direction.

In a plan view, regions in which the first external passages 23 are formed substantially coincide with regions of the refrigerant passages 21 in which the heat transfer fins 25 are formed. A heat transfer fin 23b is provided in each of the first external passages 23 along the X direction. Therefore, in the refrigerant passages 21, the refrigerant gas 1a (refrigerant liquid 1b) flows in the Y direction along the heat transfer fins 25 whereas in the first external passages 23, the external fluid 2 flows in the X direction along the heat transfer fins 23b. The condensing part 20 serves as a so-called cross-flow heat exchanger.

The side bars 43 include the through-holes 43a that define the connection passages 50 described above. The partition members 44 have a rectangular shape in which one side closer to the connecting pipe 30 is open in a plan view, and partition the connection passage 60 and the first external passages 23.

Returning to FIG. 4, the second external passages 24 are provided on the lower surface of the lowermost refrigerant passage 21b. The second external passages 24 are adjacent to the lowermost refrigerant passage 21b on the upper surface sides, and the lower surface sides thereof are installed on the installation surface 110 via a bottom plate 45. The bottom plate 45 provided on the lower surfaces of the second external passages 24 define the lower surface of the condensing part 20.

Figure 9:
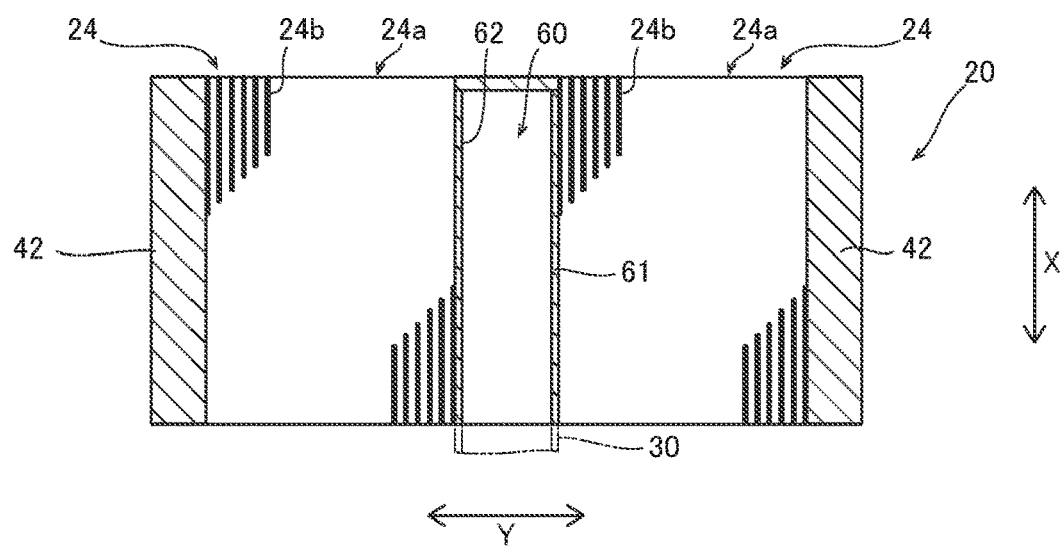
FIG. 9 A horizontal sectional view schematically showing second external passages.

The second external passages 24 are flow passages for the external fluid 2 that penetrate the condensing part 20 in the X direction basically the same as the first external passages 23. That is, the second external passages 24 are configured as flat plate-shaped flow path layers defined by the upper and lower tube plates 41 in the height direction, the bottom plate 45, the side bars 42 provided along the outer peripheral edges, and the partition members 61 at the central portion in the Y direction. As shown in FIG. 9, the second external passages 24 include openings 24a open to the outside of the condensing part 20 at opposite ends in the X direction. The openings 24a of the second external passages 24 are respectively provided on opposite sides in the Y direction with the partition members 61 (connection passage 60) at the central portion in the Y direction, which is connected to the connecting pipe 30, interposed therebetween. Thus, a pair of second external passages 24 are provided on opposite sides in the Y direction so as to penetrate the condensing part 20 in the X direction.

In a plan view, regions in which the second external passages 24 are formed substantially coincide with regions of the refrigerant passages 21 in which the heat transfer fins 25 are formed. A heat transfer fin 24b is provided in each of the second external passages 24 along the X direction. Therefore, in the second external passages 24, the external fluid 2 flows in the X direction along the heat transfer fins 24b.

The bottom surface of the connection passage 60 is defined by the partition members 61 of the second external passages 24. The partition members 61 include a concave groove 62 (see FIGS. 4 and 10) on the upper surfaces thereof, and the inner surface of the groove 62 is inclined (see FIG. 3) so as to become lower from the back side in the X direction (the side opposite to the connecting pipe 30) toward the connecting pipe 30. An end of the groove 62 in the X direction is along the end face of the connecting pipe 30, and is connected to the inner bottom surface of the connecting pipe 30. The partition members 61 are a rectangular block body in a plan view, and partition the connection passage 60 and the second external passages 24.

Returning to FIG. 1, the connecting pipe 30 is configured to connect the boiling part 10 to the condensing part 20 and circulate the refrigerant 1. The connecting pipe 30 is a hollow tubular member. FIG. 1 shows an example in which the connecting pipe 30 is a square pipe having a rectangular cross-section, but the sectional shape of the connecting pipe 30 is not particularly limited. The sectional shape of the connecting pipe 30 may be a polygon other than a rectangle, an ellipse (including a circle), or any other shape, for example.

As shown in FIGS. 2 and 3, the connecting pipe 30 connects the side surface 14 of the boiling part 10 to a side surface 26 of the condensing part 20. That is, the connecting pipe 30 connects the side surfaces of the boiling part 10 and the condensing part 20 that face each other. The connecting pipe 30 extends linearly in the X direction (horizontal direction) along the installation surface 110. Therefore, as shown in FIG. 3, the connecting pipe 30 fits within a height between the upper surface and the lower surface of the boiling part 10 (and the condensing part 20).

Figure 10:
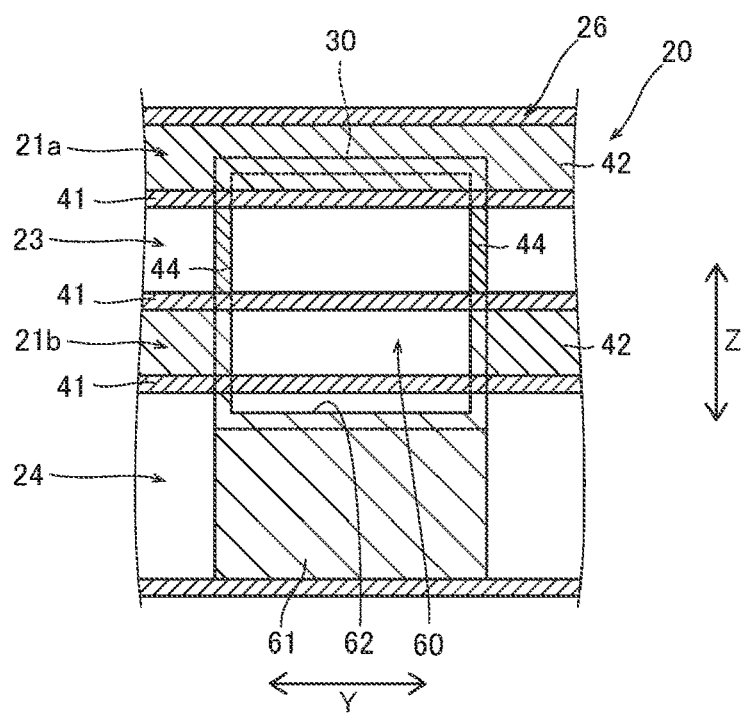
FIG. 10 A schematic view showing a connecting location with a connecting pipe of the condensing part.

Specifically, the connecting pipe 30 is connected to the connection port 13 provided on the side surface 14 of the boiling part 10 at one end. The connecting pipe 30 is connected to an open region provided on the side surface 26 of the condensing part 20 at the other end. As shown in FIG. 10, on the side surface 26 (see FIG. 3) of the condensing part 20, the open region is defined by an opening (see FIG. 7) of the partition members 44, an opening (see FIG. 8) provided in the side bars 42 in the refrigerant passages 21b, and an opening defined by the groove 62 of the partition members 61. The connecting pipe 30 is joined along the peripheral edge of the open region such that the internal space (the refrigerant passages 21 and the connection passages 50 and 60) of the condensing part 20 communicates with the connecting pipe 30.

As shown in FIG. 3, in the present embodiment, one connecting pipe 30 is provided between the boiling part 10 and the condensing part 20. Therefore, the refrigerant gas 1a and the refrigerant liquid 1b circulate through the same connecting pipe 30. In the connecting pipe 30, the refrigerant gas 1a moves toward the condensing part 20 in an upper region in the height direction, and the refrigerant liquid 1b exists in a lower region in the height direction. Therefore, the connecting pipe 30 preferably has a height dimension (inside dimension in the height direction) that allows the refrigerant gas 1a and the refrigerant liquid 1b to circulate separately from each other in order for one of the refrigerant gas 1a and the refrigerant liquid 1b not to hinder movement of the other when the refrigerant 1 circulates with its phase change.

(Dimensional Relationship Between Portions)

The dimensional relationship between portions of the cooler 100 according to the present embodiment is now described with reference to FIG. 3.

In the present embodiment, a range in the height direction (Z direction) in which the internal space 11 of the boiling part 10 is formed overlaps, in the height direction, a range in the height direction in which the lowermost refrigerant passage 21b of the condensing part 20 is formed. That is, the boiling part 10 includes the internal space 11 formed over a height range hr1. A height range hr2 in which the uppermost refrigerant passage 21a is formed and a height range hr3 in which the lowermost refrigerant passage 21b is formed fall within the height range hr1 in the height direction. Therefore, as viewed in the horizontal direction, each refrigerant passage 21 is arranged at a height at which it overlaps the internal space 11 of the boiling part 10. The height range hr1 is an example of a "range in the height direction in which the internal space of the boiling part is formed" in the claims, and the height range hr3 is a "range in the height direction in which the lowermost refrigerant passage is formed" in the claims.

In the present embodiment, the connecting pipe 30 has a height dimension H2 that is at least half the height dimension H1 of the condensing part 20. In the example of FIG. 3, the height dimension H2 is about ⅗ of the height dimension H1.

In the present embodiment, the heat receiving surface 12 of the boiling part 10 is arranged above the lower surface of the condensing part 20 arranged on the installation surface 110. The heat receiving surface 12 is provided at a height H4 from the lower surface (i.e., the installation surface 110) of the condensing part 20. The height H4 is set to substantially match a distance in the height direction from the installation surface 110 to the upper surface of the heat source HS. That is, the heat receiving surface 12 is displaced upward from the installation surface 110 by the sum of the surface height of a substrate 120 on which the CPU as the heat source HS is mounted and the mounting thickness of the CPU. The sum (H3+H4) of the height H4 of the heat receiving surface 12 and the height dimension H3 of the boiling part 10 is less than or equal to the height dimension H1 of the condensing part 20, and is substantially equal to H1 in the example of FIG. 3.

In the present embodiment, a pump or the like is not provided to move the refrigerant liquid 1b, and the refrigerant liquid 1b moves to the boiling part 10 due to the action of gravity. Therefore, when a pump or the like is not used, the refrigerant passages 21 are arranged above at least the inner bottom surface 15 of the boiling part 10. This is because when the refrigerant passages 21 are located at a height equal to or lower than the inner bottom surface 15 of the boiling part 10, the insides of the refrigerant passages 21 are constantly immersed in the refrigerant liquid 1b, and the heat transfer area for condensation is reduced.

Therefore, in the present embodiment, the second external passages 24 are provided such that upper ends thereof are located above the inner bottom surface 15 of the boiling part 10 and adjacent to the lower surface of the lowermost refrigerant passage 21b. Therefore, the lowermost refrigerant passage 21b is arranged above the inner bottom surface 15 of the boiling part 10.

The height dimensions H12 of the second external passages 24 are larger than the height dimensions H11 of the first external passages 23. In the example of FIG. 3, the height dimensions H12 of the second external passages 24 are about twice the height dimensions H11 of the first external passages 23. The height dimensions H12 of the second external passages 24 are larger than the height dimension (the size of hr2 or hr3) of each refrigerant passage 21.

In the present embodiment, the connecting pipe 30 is provided such that the liquid level of the refrigerant 1 is arranged at a predetermined height inside the pipe. Specifically, the refrigerant 1 is contained such that the liquid level of the refrigerant liquid 1b is at a predetermined height He. The predetermined height He of the liquid level is a height from the inner bottom surface 15 of the boiling part 10. The predetermined height He is set to a position above the inner bottom surface of the connecting pipe 30. Therefore, inside the connecting pipe 30, its inner bottom portion is immersed in the refrigerant liquid 1b. The lowermost refrigerant passage 21b is arranged above the inner bottom surface of the connecting pipe 30. The predetermined height He is set with a position at which the lowermost refrigerant passage 21b is arranged (the position of the inner bottom surface of the refrigerant passage 21) as an upper limit. The predetermined height He is set to a height between the inner bottom surface of the connecting pipe 30 and a position at which the lowermost refrigerant passage 21b is arranged.

(Heat Transfer Fins)

The heat transfer fins 25 in the refrigerant passages 21, the heat transfer fins 23b in the first external passages 23, and the heat transfer fins 24b in the second external passages 24 are corrugated fins, for example. Although FIG. 4 shows corrugated fins having curved wavy cross-sections, corrugated fins having rectangular cross-sections may be used, for example. As the heat transfer fins 25, the heat transfer fins 23b, and the heat transfer fins 24b, fins having the same shape may be used, or fins having different shapes may be used. The fins may be any fins such as plain fins, perforated fins, louver fins, herringbone fins, or serrated fins (offset fins).

(Operation of Cooler)

The operation of the cooler 100 is described. As shown in FIG. 3, when the heat source HS generates heat, the refrigerant 1 in the boiling part 10 is boiled and vaporized to become the refrigerant gas 1a. The internal space 11 of the boiling part 10 is filled with the refrigerant gas 1a, and the refrigerant gas 1a flows into the connecting pipe 30 from the boiling part 10 as boiling continues. The refrigerant gas 1a flows into the condensing part 20 via the connecting pipe 30. In the condensing part 20, the refrigerant gas 1a flows into the central portion in the Y direction of each refrigerant passage 21 directly or via the connection passage 60. The inflowing refrigerant gas 1a flows through the refrigerant passages 21 along the heat transfer fins 25 from the central portion in the Y direction to the outside.

On the other hand, air as the external fluid 2 is sent to the condensing part 20 by an external fan, for example. The external fluid 2 (see FIG. 1) flows into the first external passages 23 and the second external passages 24, as shown in FIG. 4. In the first external passages 23 and the second external passages 24, the external fluid 2 flows in the X direction along the heat transfer fins 23b and 24b. Consequently, heat exchange is performed between the refrigerant 1 and the external fluid 2 via the heat transfer fins 25 of each refrigerant passage 21, the tube plates 41 between the refrigerant passages 21 and the external passages (the first external passages 23 or the second external passages 24), and the heat transfer fins 23b (24b) of the external passages 22. Due to the heat exchange, the condensation heat of the refrigerant gas 1a is released to the external fluid 2, and the refrigerant gas 1a is condensed to become the refrigerant liquid 1b. In this manner, in each of the refrigerant passages 21a and 21b, the refrigerant gas 1a is condensed and changes its phase to the refrigerant liquid 1b.

The refrigerant liquid 1b is accumulated at the bottom of each refrigerant passage 21 (21a and 21b). When the amount of condensed refrigerant liquid 1b increases, the refrigerant liquid 1b drops from the uppermost refrigerant passage 21b via the connection passages 50 and the connection passage 60 and moves to the lowermost refrigerant passage 21b or the groove 62. In the lowermost refrigerant passage 21b, the refrigerant liquid 1b condensed in the refrigerant passage 21b and the refrigerant liquid 1b moved via the connection passages 50 are collected. The refrigerant liquid 1b collected in the lowermost refrigerant passage 21b flows into the groove 62 of the connection passage 60 at the central portion in the Y direction, and flows into the connecting pipe 30 via the groove 62. The refrigerant liquid 1b that has flowed into the connecting pipe 30 merges with the refrigerant liquid 1b in the boiling part 10 via the inside of the connecting pipe 30. In this manner, the refrigerant 1 circulates between the boiling part 10 and the condensing part 20 with its phase change such that the heat source HS is cooled.

Advantageous Effects of Present Embodiment

According to the present embodiment, the following advantageous effects are achieved.

According to the present embodiment, as hereinabove described, the condensing part 20 arranged in the horizontal direction with respect to the boiling part 10 includes the plurality of stages of refrigerant passages 21 aligned in the height direction. Accordingly, as compared with a case in which the refrigerant passages 21 are arranged above the boiling part 10, the height dimension can be reduced, and even within a predetermined height dimension (1 U), a sufficient heat transfer area (heat radiation area) can be ensured due to each refrigerant passage 21. Furthermore, the first external passages 23 are provided between the plurality of stages of refrigerant passages 21, and thus heat exchange with the external fluid 2 in each of the refrigerant passages 21 can be efficiently performed. In addition, the second external passages 24 are also provided on the lower surface of the lowermost refrigerant passage 21b, and thus the heat radiation performance can be improved due to the second external passages 24. Therefore, it is possible to balance a reduction in the height dimension of the cooler 100 and an improvement in the heat radiation performance. Consequently, in the cooler 100 according to the present embodiment, the cooling performance can be ensured while an increase in the height dimension is significantly reduced or prevented. Even when the second external passages 24 are provided on the upper surface of the uppermost refrigerant passage 21a, the cooling performance can be similarly ensured while an increase in the height dimension is significantly reduced or prevented.

The boiling part is provided such that the range (height range hr1) in the height direction in which the internal space 11 of the boiling part 10 is formed overlaps, in the height direction (Z direction), the range (height range hr3) in the height direction in which the lowermost refrigerant passage 21b of the condensing part 20 is formed. Accordingly, an increase in the height dimension of the cooler 100 can be significantly reduced or prevented. Consequently, it is possible to easily ensure a space in which the plurality of stages of refrigerant passages 21 are provided even within the predetermined height dimension.

The connecting pipe 30 connects the side surface 26 of the condensing part 20 to the side surface 14 of the boiling part 10 in a lateral direction. Accordingly, unlike a case in which the connecting pipe is connected to the upper surface of the boiling part, an increase in the height dimension of the cooler 100 can be effectively significantly reduced or prevented.

One connecting pipe 30 is provided. Accordingly, the height dimension of the cooler 100 can be reduced as compared with a case in which a plurality of connecting pipes 30 are provided. Furthermore, the height dimension H2 of the connecting pipe 30 is set to be at least half the height dimension H1 of the condensing part 20, and thus the sectional area of the connecting pipe 30 required to circulate both the refrigerant gas 1a and the refrigerant liquid 1b can be effortlessly ensured even within the predetermined height dimension (1 U).

The heat receiving surface 12 is arranged above the lower surface (installation surface 110) of the condensing part 20. Accordingly, the heat source HS can be attached to the heat receiving surface 12 displaced upward by the thickness of the heat source HS from the lower surface of the condensing part 20 to be cooled. On the other hand, it is not necessary to displace the lower surface of the condensing part 20 upward from the installation surface 110, and thus the heat radiation performance can be ensured, maximizing the use of a height space having the predetermined height dimension (1 U) from the installation surface 110.

The second external passages 24 are provided on the lower surface of the lowermost refrigerant passage 21b. Accordingly, the lowermost refrigerant passage 21b can be arranged correspondingly upward. Consequently, even when the condensing part 20 is arranged in the horizontal direction with respect to the boiling part 10, utilizing the second external passages 24 that improve the heat radiation performance, the arrangement position of the lowermost refrigerant passage 21b can be easily raised.

The second external passages 24 include upper ends located above the inner bottom surface 15 of the boiling part 10 and adjacent to the lower surface of the lowermost refrigerant passage 21b. Accordingly, the lowermost refrigerant passage 21b can be reliably arranged above the inner bottom surface 15 of the boiling part 10 while the heat exchange performance with the external fluid 2 is ensured.

The second external passages 24 have the height dimensions H12 larger than the height dimensions H11 of the first external passages 23. Accordingly, even in the configuration in which the first external passages 23 are provided between the plurality of stages of refrigerant passages 21, the height of the refrigerant passages 21 required to return the refrigerant liquid 1b to the boiling part 10 can be easily ensured. Furthermore, unlike a case in which a support post or a space is simply provided on the lower surface side of the refrigerant passages 21 such that the height of the refrigerant passages 21 is ensured, the second external passages 24, the height dimensions of which are increased by a space required to ensure the height of the refrigerant passages 21, are provided such that heat exchange with the external fluid 2 can be actively performed. Thus, the heat exchange performance with the external fluid 2 can be improved.

The liquid level of the refrigerant 1 is arranged at the predetermined height inside the connecting pipe 30, and in addition to the boiling part 10, the connecting pipe 30 is filled with the refrigerant liquid 1b to the predetermined height He. Accordingly, even when the amount of heat generated by the heat source HS is large, vaporization of the entire refrigerant liquid 1b in the boiling part 10 can be significantly reduced or prevented. Moreover, when the refrigerant liquid 1b condensed by the condensing part 20 is returned to the boiling part 10 side, the same can merge with the stored refrigerant liquid 1b when reaching the position of the liquid level inside the connecting pipe 30. Therefore, the refrigerant liquid 1b that merges inside the connecting pipe 30 can be reused to cool the heat source HS in the boiling part 10.

Modified Examples

The embodiment disclosed this time must be considered as illustrative in all points and not restrictive. The scope of the present invention is not shown by the above description of the embodiment but by the scope of claims for patent, and all modifications (modified examples) within the meaning and scope equivalent to the scope of claims for patent are further included.

For example, while the example in which the heat source HS is a semiconductor chip or an electronic circuit of a CPU or the like mounted on an electronic device such as a server has been shown in the aforementioned embodiment, the present invention is not restricted to this. In the present invention, the heat source may be anything. The present invention is particularly effective in applications in which an installation space for a cooler configured to cool a heat source is restricted in the height direction. Therefore, the present invention can be suitably used in a case in which the installation space for the cooler in the height direction cannot be sufficiently ensured in a housing of a device due to the dimensional restrictions of the device including a heat source, other than a device housed in the server rack.

While the example in which one boiling part 10 and one condensing part 20 are provided has been shown in the aforementioned embodiment, the present invention is not restricted to this. In the present invention, a plurality of boiling parts 10 may be provided for one condensing part 20. The plurality of boiling parts 10 may be provided separately from each other, or may have a structure in which a plurality of refrigerant storages are partitioned in a common housing.

When the plurality of boiling parts 10 are provided, the boiling parts 10 may be individually connected to the condensing part 20 by connecting pipes 30, or may be connected to the condensing part 20 by one manifold connecting pipe that branches from the condensing part 20 and connects to each boiling part 10.

While the example in which the connecting pipe 30 extends in the horizontal direction along the installation surface 110 has been shown in the aforementioned embodiment, the present invention is not restricted to this. The connecting pipe may be inclined in the height direction with respect to the horizontal direction along the installation surface 110. For example, the connecting pipe 30 may be inclined downward from the condensing part 20 toward the boiling part 10.

While the example in which the second external passages 24 are provided only on the lower surface of the lowermost refrigerant passage 21b of the uppermost and lowermost refrigerant passages 21b has been shown in the aforementioned embodiment, and the example in which the second external passages 24 are provided on each of the uppermost and lowermost refrigerant passages 21b has been shown in the aforementioned second embodiment, the present invention is not restricted to this. The second external passages 24 may be provided only on the upper surface of the uppermost refrigerant passage 21a of the uppermost and lowermost refrigerant passages 21b.

While the example in which the height range hr1 in which the internal space 11 of the boiling part 10 is formed overlaps, in the height direction, the height range hr3 in which the lowermost refrigerant passage 21b of the condensing part 20 is formed has been shown in the aforementioned embodiment, the present invention is not restricted to this. In the present invention, the height range hr1 in which the internal space 11 of the boiling part 10 is formed may not overlap, in the height direction, the height range hr3 in which the lowermost refrigerant passage 21b of the condensing part 20 is formed. Alternatively, a range in which a portion of the plurality of stages of refrigerant passages 21 is formed may overlap, in the height direction, the range in which the internal space 11 of the boiling part 10 is formed, and a range in which the remaining refrigerant passages 21 are formed may not overlap, in the height direction, the range in which the internal space 11 of the boiling part 10 is formed. As in the aforementioned embodiment, a range in which all of the plurality of stages of refrigerant passages 21 are formed may overlap, in the height direction, the range in which the internal space 11 of the boiling part 10 is formed. Besides, the range in which all the refrigerant passages 21 are formed may not overlap, in the height direction, the range in which the internal space 11 of the boiling part 10 is formed.

While the example in which the connecting pipe 30 connects the side surface 14 of the boiling part 10 to the side surface 26 of the condensing part 20 has been shown in the aforementioned embodiment, the present invention is not restricted to this. In the present invention, the connecting pipe 30 may be connected to a surface other than the side surfaces of the boiling part 10 and the condensing part 20. For example, the connecting pipe 30 may be connected to the upper surface of the boiling part 10.

While the example in which the connecting pipe 30 has the height dimension H2 that is at least half the height dimension H1 of the condensing part 20 has been shown in the aforementioned embodiment, the present invention is not restricted to this. In the present invention, the height dimension H2 of the connecting pipe 30 may be less than half the height dimension H1 of the condensing part 20.

While the example in which the upper ends of the second external passages 24 are provided above the inner bottom surface 15 of the boiling part 10 and adjacent to the lower surface of the lowermost refrigerant passage 21b has been shown in the aforementioned embodiment, the present invention is not restricted to this. In the present invention, the upper ends of the second external passages 24 may not be adjacent to the lower surface of the lowermost refrigerant passage 21b, and a member that thermally connects the second external passages 24 to the refrigerant passage 21 may be provided. Alternatively, the upper ends of the second external passages 24 may not be arranged above the inner bottom surface 15 of the boiling part 10.

While the example in which the height dimensions H12 of the second external passages 24 are larger than the height dimensions H11 of the first external passages 23 has been shown in the aforementioned embodiment, and the example in which the height dimensions H12 of the second external passages 24 are substantially equal to the height dimensions H11 of the first external passages 23 has been shown in the aforementioned second embodiment, the present invention is not restricted to this. In the present invention, the height dimensions H12 of the second external passages 24 may be smaller than the height dimensions H11 of the first external passages 23.

While the example in which the connecting pipe 30 is provided such that the liquid level of the refrigerant 1 is arranged at the predetermined height He inside the pipe has been shown in the aforementioned embodiment, the present invention is not restricted to this. The connecting pipe 30 may be provided above the height of the liquid level.

While the example in which the external passages 22 (the first external passages 23 and the second external passages 24) penetrate the condensing part 20 in the X direction has been shown in the aforementioned embodiment, the present invention is not restricted to this. In the present invention, the external passages 22 (the first external passages 23 and the second external passages 24) may penetrate the condensing part in the Y direction.

While the example in which the condensing part 20 has a rectangular parallelepiped shape that extends in the Y direction, and the connecting pipe 30 is connected to the central portion of the condensing part 20 in the Y direction has been shown in the aforementioned embodiment, the present invention is not restricted to this. In the present invention, the planar arrangement and shapes of the boiling part 10, the connecting pipe 30, and the condensing part 20 are arbitrary. The planar arrangement and shapes of the boiling part 10, the connecting pipe 30, and the condensing part 20 may be appropriately set depending on the position and size of the heat source HS in the installation space or the arrangement of members around the heat source HS, for example.

While the example in which the partition members 61 include the groove 62 that defines the bottom surface of the connection passage 60, and the inner surface of the groove 62 is inclined so as to become lower toward the connecting pipe 30 has been shown in the aforementioned embodiment, the present invention is not restricted to this. The inner surface of the groove 62 may not be inclined but may be horizontal. Alternatively, the groove 62 may not be provided. In that case, the flat upper surfaces of the partition members 61 or the tube plate 41 may define the bottom surface of the connection passage 60. Furthermore, as shown in FIG. 3, the example in which the end (the bottom surface of the connection passage 60) of the groove 62 in the X direction is connected to the inner bottom surface of the connecting pipe 30 has been shown, but a connecting portion between the bottom surface of the connection passage 60 and the inner bottom surface of the connecting pipe 30 may have a step.

DESCRIPTION OF REFERENCE NUMERALS

1: refrigerant
2: external fluid
10: boiling part
11: internal space
12: heat receiving surface
14: side surface
15: inner bottom surface
20: condensing part
21, 21a, 21b: refrigerant passage
23: first external passage
24: second external passage
26: side surface
30: connecting pipe
100: cooler (boiling cooler)
H11: height dimension of the first external passage
H12: height dimension of the second external passage
He: height of the liquid level (predetermined height)
hr1: range in the height direction in which the internal space of the boiling part is formed
hr3: range in the height direction in which the lowermost refrigerant passage is formed
HS: heat source

The invention claimed is:

1. A boiling cooler comprising:
a boiling part including a heat receiving surface thermally connected to a heat source, the boiling part boiling a refrigerant contained in an internal space thereof;
a condensing part arranged in a horizontal direction with respect to and spaced apart from the boiling part, the condensing part condensing a refrigerant gas by heat exchange with an external fluid; and
a connecting pipe that connects the boiling part to the condensing part and circulates the refrigerant; wherein the condensing part includes:
    a plurality of stages of refrigerant passages aligned in a height direction perpendicular to the horizontal direction; and
    a first external passage for the external fluid provided between the plurality of stages of refrigerant passages, and a second external passage for the external fluid provided on an outer surface of at least one of an uppermost refrigerant passage and a lowermost refrigerant passage; and
a range in the height direction in which the internal space of the boiling part is formed overlaps, in the height direction, both of a range in the height direction in which the lowermost refrigerant passage of the condensing part is formed and a range in the height direction in which the uppermost refrigerant passage of the condensing parts is formed,
the connecting pipe is provided separately from the refrigerant passages and connected to the boiling part at one end and to the condensing part at an opposite end, and
the second external passage includes heat transfer fins provided inside of the second external passage.

2. The boiling cooler according to claim 1, wherein the heat receiving surface of the boiling part is arranged above a lower surface of the condensing part.

3. The boiling cooler according to claim 1, wherein the second external passage is provided on at least a lower surface of the lowermost refrigerant passage.

4. The boiling cooler according to claim 3, wherein the second external passage includes an upper end located above an inner bottom surface of the boiling part and adjacent to the lower surface of the lowermost refrigerant passage.

5. The boiling cooler according to claim 4, wherein the second external passage has a height dimension larger than a height dimension of the first external passage.

6. The boiling cooler according to claim 1, wherein the connecting pipe is provided such that a liquid level of the refrigerant is arranged at a predetermined height inside the connecting pipe.

* * * * *